United States Patent
Becker et al.

(10) Patent No.: US 7,002,810 B1
(45) Date of Patent: Feb. 21, 2006

(54) SYSTEM AND METHOD FOR HOUSING ELECTRONIC EQUIPMENT IN A RACK

(75) Inventors: Donnan F. Becker, Arlington, VA (US); Patrick J. Crone, Reston, VA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/741,864

(22) Filed: Dec. 19, 2003

(51) Int. Cl.
*H05K 7/14* (2006.01)
*H05K 7/18* (2006.01)

(52) U.S. Cl. .................... 361/796; 361/825; 361/826

(58) Field of Classification Search ............. 361/796, 361/797, 800, 752, 825, 826, 756, 727, 741, 361/686, 802; 174/72 A
See application file for complete search history.

(56) References Cited

U.S. PATENT DOCUMENTS 6,719,149 B1 * 4/2004 Tomino ................ 211/26

OTHER PUBLICATIONS

"Wall Mount Racks for Servers—Photo Gallery", from RackSolutions.com; printed Dec. 11, 2003; http://www.racksolutions.com/wall-mount-rack-photos.shtml.

* cited by examiner

*Primary Examiner*—Randy W. Gibson
*Assistant Examiner*—Hung S. Bui
(74) *Attorney, Agent, or Firm*—Baker Botts L.L.P.

(57) ABSTRACT

According to one embodiment of the invention, a system for housing electronic equipment includes a slide assembly configured to mount to either an inner top or inner bottom of a rack and a pair of opposed side panels coupled to the slide assembly. Each side panel has a plurality of ledges extending inwardly therefrom that are configured to support respective ones of a plurality of electronic units. The slide assembly is operable to extend the side panels outwardly from a front of the rack a distance that allows access to an area between the rears of the side panels.

22 Claims, 3 Drawing Sheets

SYSTEM AND METHOD FOR HOUSING ELECTRONIC EQUIPMENT IN A RACK

TECHNICAL FIELD OF THE INVENTION

This invention relates generally to the field of housing electronic equipment and, more specifically, to a system and method for housing electronic equipment in a rack.

BACKGROUND OF THE INVENTION

Electronic components, such as computer components, are often stored in storage "racks" for space saving considerations. Racks are often placed against a wall, which prevents personnel from accessing the rears of the electronic components if the racks are securely mounted to the floor and/or are too large or heavy to move. Therefore, to access the rear of the components, side-mounted slides are sometimes used for each individual component. However, since these electronic components are oftentimes connected to one another with cables, the cables have to be long enough to facilitate this access method. If the cables are too short, then the side-mounted slides are not feasible. In addition, depending on the size of the rack, the components may be too wide to accommodate side-mounted slides.

SUMMARY OF THE INVENTION

According to one embodiment of the invention, a system for housing electronic equipment includes a slide assembly configured to mount to either an inner top or inner bottom of a rack and a pair of opposed side panels coupled to the slide assembly. Each side panel has a plurality of ledges extending inwardly therefrom that are configured to support respective ones of a plurality of electronic units. The slide assembly is operable to extend the side panels outwardly from a front of the rack a distance that allows access to an area between the rears of the side panels.

Some embodiments of the invention provide numerous technical advantages. Other embodiments may realize some, none, or all of these advantages. For example, all electronic units stored in a rack are able to slide out the front of rack simultaneously so that all units and cables are accessible from the back of units. This eliminates having to move the rack away from a wall or other obstruction in order to access the back of the units. In addition, this allows short cables to be utilized between the units. A bezel may be used to allow the chassis to extend past the front of rack and to allow the securing of units to the chassis.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EMBODIMENTS OF THE INVENTION

Figure 1:
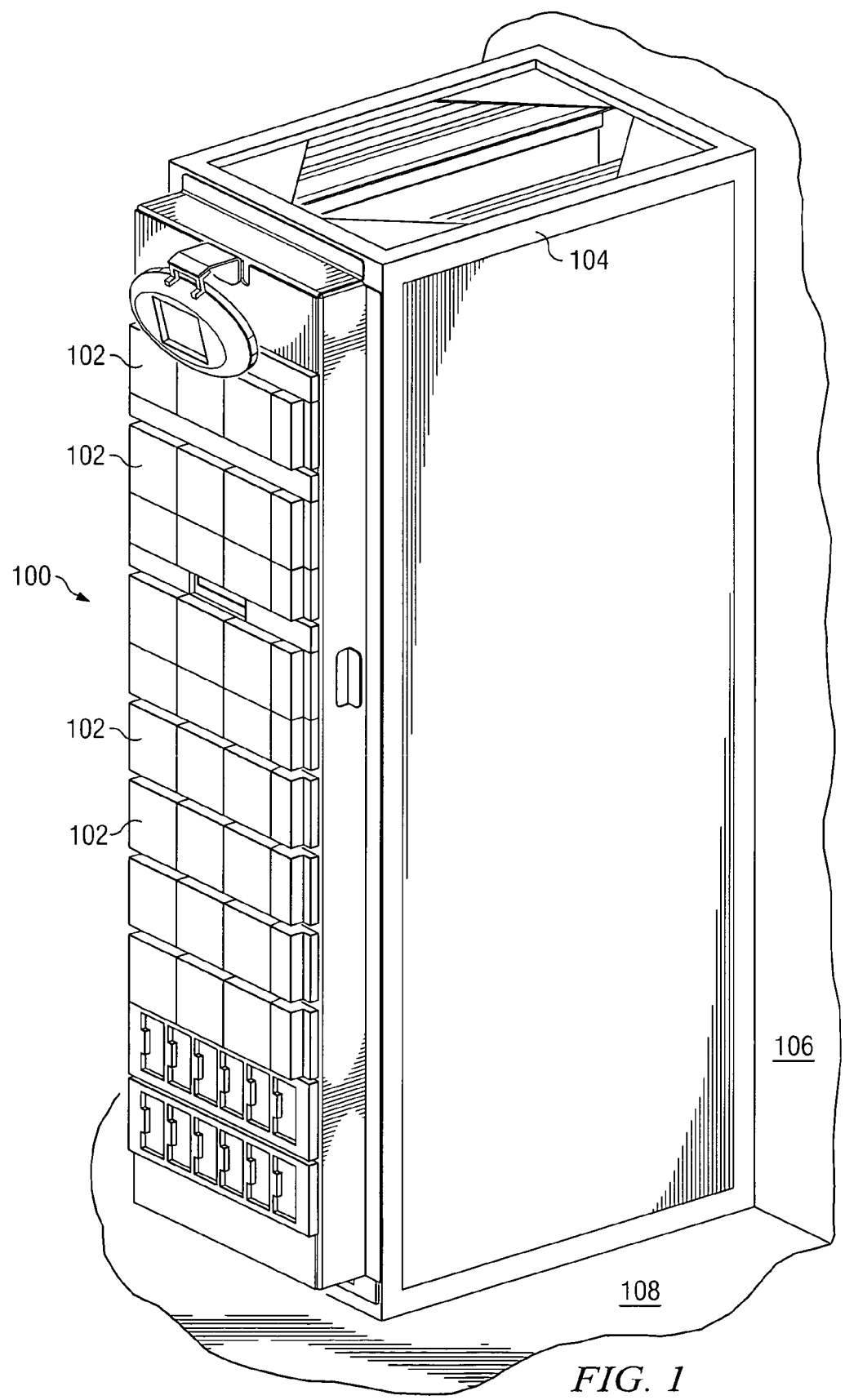
FIG. 1 is a perspective view of a chassis housing a plurality of electronic units and stored within a rack according to one embodiment of the present invention.

FIG. 1 is a perspective view of a chassis 100 housing a plurality of electronic units 102 and stored within a rack 104 according to one embodiment of the present invention. In the illustrated embodiment, rack 104 is a 19" Electronic Industries Alliance ("EIA") standard rack; however, rack 104 may be any suitable rack utilized to store electronic units 102. Electronics units 102, in the illustrated embodiment, are computer components related to the Origin® 3800 supercomputer from Silicon Graphics, Inc. ("SGI"). However, electronic units 102 represent any suitable electronic components desired to be stored in rack 104. For example, electronic units 102 may be telecommunications equipment, radio equipment, video equipment, or other suitable electronic components.

According to the teachings of one embodiment of the present invention, chassis 100 functions to translate electronic units 102 simultaneously into and out of rack 104 in order to allow personnel access to the rear of electronic units 102 without having to move rack 104. Oftentimes racks are placed against a wall, such as wall 106, in order to save space. In addition, storage racks are sometimes secured to a base, such as floor 108, for security and safety reasons. This prevents personnel from accessing the rear of electronic components stored in the rack. Because electronic units 102 are sometimes coupled to one another with relatively short cables, chassis 100 is utilized within the teachings of the invention to allow personnel to translate electronic units 102 simultaneously out from rack 104 a sufficient distance that access to the rear of electronic units 102 is feasible. Components of one embodiment of chassis 100 are described in greater detail below in conjunction with FIG. 2.

Figure 2:
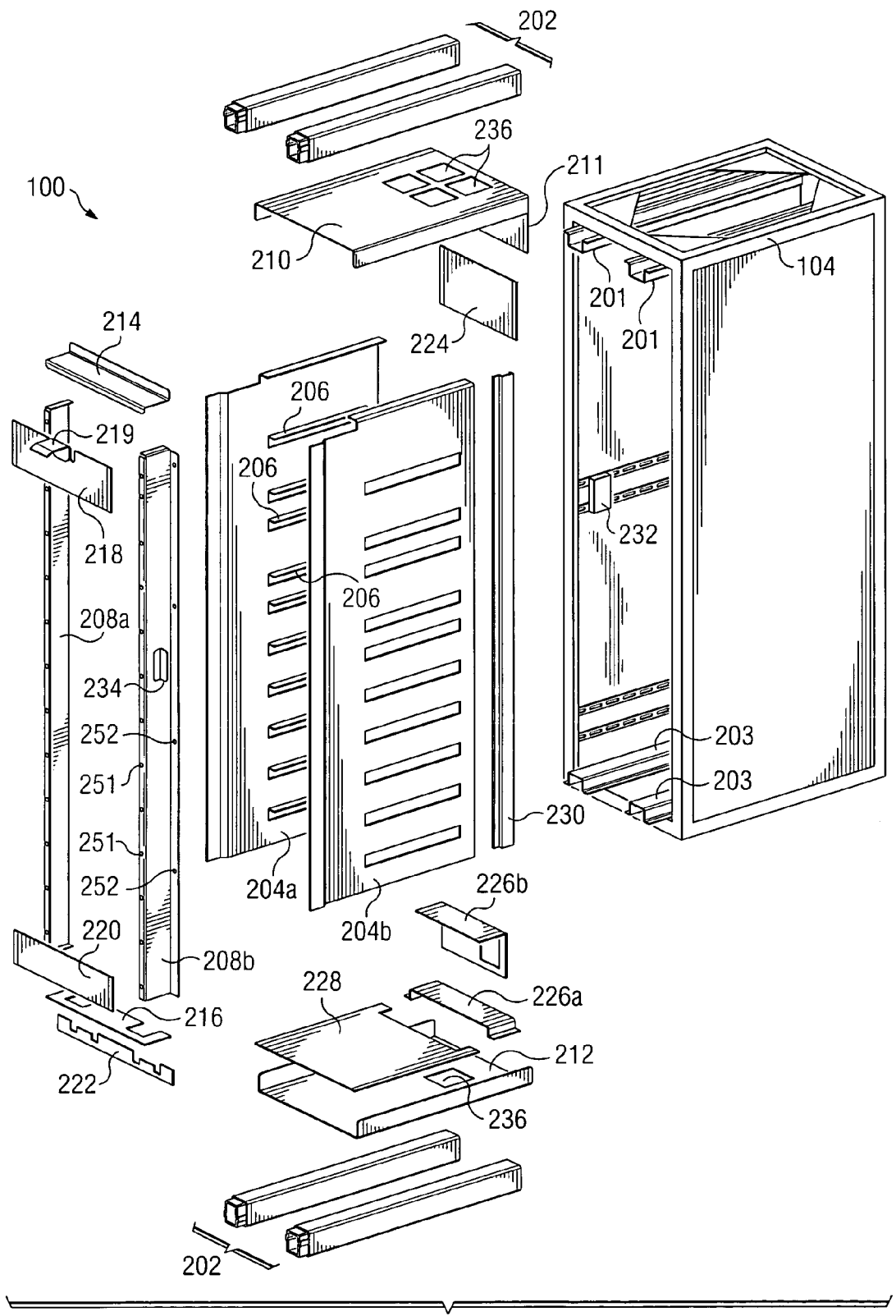
FIG. 2 is an exploded, perspective view illustrating the chassis of FIG. 1 according to one embodiment of the present invention.

FIG. 2 is an exploded, perspective view illustrating chassis 100 according to one embodiment of the invention. The present invention contemplates more, less, or different components than those shown in FIG. 2. In the illustrated embodiment, chassis 100 includes a first pair of slides 200 that couple to respective ones of a first pair of slide mounting brackets 201, a second pair of slides 202 coupled to respective ones of a second pair of slide mounting brackets 203, a pair of opposed side panels 204a, 204b each having a plurality of ledges 206 extending inwardly therefrom, a pair of side bezels 208a, 208b, a top plate 210 having a vertical extension 211, a bottom plate 212, a top bezel 214, a bottom bezel 216, a front panel 218 having a mounting bracket 219, a blank panel 220, a bottom plate 222, an upper mounting bracket 224, a pair of lower mounting brackets 226a, 226b, a spacer 228, a cable support 230, a chassis guide 232, and a handle 234.

In one embodiment, side panels 204a, 204b, side bezels 208a, 208b, top plate 210, bottom plate 212, and lower mounting brackets 226a, 226b, are formed from a stainless steel for strength purposes. However, these elements as well as the rest of the elements illustrated in FIG. 2 may be formed from any suitable material, such as aluminum. In addition, all the elements illustrated in FIG. 2 are sized to fit a 19" EIA standard rack. However, all elements comprising chassis 100 should be suitably sized based on the size and shape of the particular rack that it is going to be associated with.

Slide mounting rails 201 couple to an inner top of rack 104 and slide mounting rails 203 couple to an inner bottom of rack 104 in any suitable manner. In addition, both slides 200, 202 couple to their respective slide mounting brackets 201, 203 in any suitable manner, such as with fasteners.

Slides 200, 202 are the components that allow chassis 100 to be translated into and out of rack 104. Any suitable slides may be utilized within the teachings of the present invention; however, in the illustrated embodiment, slides 200, 202 are model number C-1050-34 from General Devices Company, Inc.

Side panels 204a, 204b work in conjunction with one another to support electronic units 102 in spaced relation to one another via ledges 206. Ledges 206 may be formed integral with side panels 204a, 204b or may be separate components that are coupled to side panels 204a, 204b. Ledges 206 may extend any suitable distance inwardly from their respective side panel 204a, 204b. Ledges 206 may be spaced any suitable distance apart, but this spacing is typically dictated by the size of electronic units 102. The tops of side panels 204a, 204b may couple to slides 200 directly or via top plate 210 in any suitable manner, such as fasteners. Similarly, the bottoms of side panels 204a, 204b may couple to slides 202 directly or via bottom plate 212 in any suitable manner, such as with fasteners. Depending on dimensional requirements, one or more spacers 228 may be utilized in conjunction with bottom plate 212 to accommodate any dimensional requirements or strength requirements. The coupling of side panels 204a, 204b to both slides 200 and slides 202 allows side panels 204a, 204b to be translated into and out of rack 104, which facilitates the ability to extend electronic units 102 outwardly from rack 104 simultaneously in order to access the rear of electronic units 102.

Both top plate 210 and bottom plate 212 may be utilized not only to couple side panels 204a, 204b to slides 200, 202, but may also be utilized for structural integrity purposes. In order to promote cooling within the volume enclosed by side panels 204a, 204b, top plate 210 and bottom plate 212, apertures 236 may be formed in top plate 210 and bottom plate 212 to allow air to flow therethrough, whether forced or unforced. Depending on the types of electronic units 102 utilized within chassis 100, top plate 210 may have vertical extension 211 coupled at a back end thereof to allow an additional mounting bracket 224 to couple thereto for mounting a particular electronic component to mounting bracket 224. For example, in the illustrated embodiment, a controller for the Origin® 3800 supercomputer shown may couple to mounting bracket 224. Similarly, bottom plate 212 may facilitate the coupling of mounting brackets 226a, 226b thereto in order to couple other components of electronic units 102 thereto. For example, in the illustrated embodiment, power supplies (not illustrated) may be coupled to mounting brackets 226a, 226b. Mounting brackets 224, 226a and 226b may couple to top plate 210 and bottom plate 212 in any suitable manner, such as with fasteners. Cable support 230 may also couple to one or both side panels 204a, 204b to provide support for any cables utilized with electronic units 102. Cable support 230 may have any suitable configuration and may couple to side panels 204a, 204b in any suitable manner.

Side bezels 208a, 208b couple to respective ones of side panels 204a, 204b in any suitable manner to provide strength and stiffness for side panels 204a, 204b. Side bezels 208a, 208b each have a first set of mounting holes 251 formed along a front edge thereof for securing electronic units 102 thereto and a second set of mounting holes 252 for securing chassis 100 to rack 104. Handle 234 may be associated with either one or both of side bezels 208a, 208b to aid in the translation of chassis 100 into and out of rack 104. Handle 234 may couple to side bezels 208a, 208b in any suitable manner, such as by welding.

For additional strength and stiffness, top bezel 214 and bottom bezel 216 may be coupled to side bezels 208a, 208b in any suitable manner. Side bezels 208a, 208b may also accommodate front panel 218 having a mounting bracket 219 for securing a component of electronic units 102 thereto. For example, in the illustrated embodiment, mounting bracket 219 functions to mount a keypad of the Origin® 3800 supercomputer. In addition, blank panel 220 and bottom plate 222 may be coupled to the bottom region of size bezels 208a, 208b for any suitable purpose, such as additional strength and stiffness, aesthetic purposes, or to provide additional mounting surfaces thereto.

Although slides 200, 202 and slide mounting brackets 201, 203 provide guidance for chassis 100 when translating into and out of rack 104, one or more optional chassis guides 232 may be coupled to an inside surface of rack 104 to aid in guiding chassis 100. Any suitable guide is contemplated by the present invention.

Figure 3:
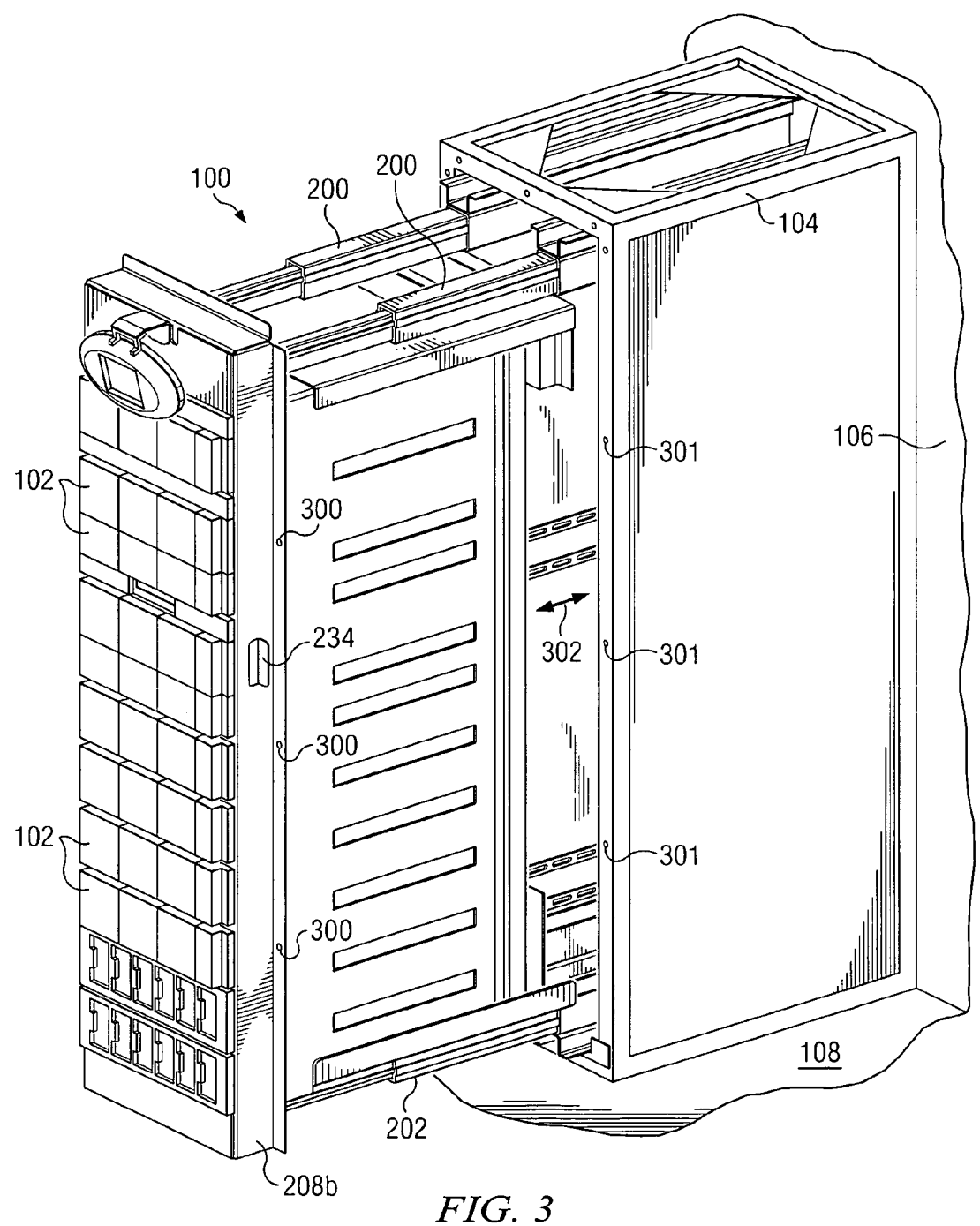
FIG. 3 illustrates the chassis of FIG. 1 being utilized to slide all of the electronic units out of the rack simultaneously according to one embodiment of the present invention.

FIG. 3 illustrates chassis 100 in one mode of operation. More specifically, FIG. 3 illustrates chassis 100 housing the Origin® 3800 supercomputer by SGI and storing the same in rack 104. As illustrated, rack 104 is placed against wall 106 and secured to floor 108 such that access to the rear of rack 104 is not feasible. Therefore, chassis 100 is extended outwardly from a front of rack 104 a distance that allows access to the rear of electronic units 102. The access is illustrated by gap 302. Personnel may then be able to access any cables that are coupled between electronic units 102. Extension of chassis 100 out from the front of rack 104 is facilitated by slides 200, 202, which are shown in an extended position in FIG. 3. In one embodiment, before chassis 100 is able to extended out from rack 104, one or more fasteners 300 are unfastened from threaded holes 301 formed in a front of rack 104. Handle 234 on side bezel 208b may then be used to aid in extending chassis 100 out from rack 104. When access to the rear of electronic units is no longer desired, then handle 234 may be utilized to translate chassis 100 back into rack 104 and secured thereto by fasteners 300.

Thus, chassis 100 eliminates having to move rack 104 away from wall 106 or other suitable obstruction in order to access the rear of electronic units 102. This allows short cables to be utilized between electronic units 102 and reduces the costs associated with installing multiple side-mounted slides in rack 104, which may not be possible in some embodiments depending on the size of electronic units 102 and rack 104. Chassis 100 also facilitates the efficient removal of electronic units 102 from rack 104, as discussed above. For example, if one of the electronic units 102 is desired to be removed, then chassis 104 may be extended outwardly from the front of rack 104, the cable associated with the particular electronic unit 102 that is desired to be removed is disconnected, and the electronic unit 102 is then removed from chassis 100. Chassis 100 may then be translated back into rack 104.

Although embodiments of the invention and their advantages are described in detail, a person skilled in the art could make various alterations, additions, and omissions without departing from the spirit and scope of the present invention, as defined by the appended claims.

What is claimed is:

1. A system for housing electronic equipment, comprising:
   a rack;
   a first pair of slide mounting brackets coupled to an inner top of the rack;

a second pair of slide mounting brackets coupled to an inner bottom of the rack;

a first pair of slides coupled to respective ones of the first pair of slide mounting brackets;

a second pair of slides coupled to respective ones of the second pair of slide mounting brackets;

a pair of opposed side panels coupled to the first and second pair of slides, each side panel having a plurality of ledges extending inwardly therefrom;

a plurality of electronic units supported by respective ones of the plurality of ledges, at least two of the electronic units coupled to one another with a cable; and whereby the first and second pair of slides are operable to extend the side panels outwardly from a front of the rack a distance that allows access to an area between the rears of the side panels.

2. The system of claim 1, further comprising:

a pair of side bezels coupled to respective ones of the side panels, the side bezels having a set of mounting holes for securing the side bezels to the rack; and a handle coupled to one of the side bezels for extending the side panels outwardly from the front of the rack.

3. The system of claim 2, further comprising a mounting bracket coupled to one of the side bezels.

4. The system of claim 2, further comprising:

a top bezel coupling the tops of the side bezels; and a bottom bezel coupling the bottoms of the side bezels.

5. The system of claim 1, further comprising:

a top plate coupling the tops of the pair of opposed sides;

a bottom plate coupling the bottoms of the pair of opposed sides; and a plurality of apertures formed in the top and bottom plates to allow air to enter and exit a volume enclosed by the side panels, the top plate, and the bottom plate.

6. The system of claim 5, wherein the top plate comprises a vertical extension for providing a mounting surface.

7. The system of claim 5, further comprising a power supply mounting plate coupled to either the bottom plate or the side panels.

8. The system of claim 1, wherein the side panels are formed from stainless steel.

9. The system of claim 1, wherein the rack is a 19 inch EIA standard rack.

10. A system for housing electronic equipment, comprising:

a slide assembly configured to mount to both an inner top and inner bottom of a rack;

a pair of opposed side panels coupled to the slide assembly, each side panel having a plurality of ledges extending inwardly therefrom configured to engage and support respective ones of a plurality of electronic units in a vertically stacked manner;

a pair of side bezels coupled to respective ones of the side panels, the side bezels having a first set of mounting holes for securing the electronic units to the side bezels and a second set of mounting holes for securing the side panels to the rack; and whereby the slide assembly is operable to translate the side panels into and out of the rack.

11. The system of claim 10, further comprising a handle coupled to one of the side bezels configured to aid in translate the side panels.

12. The system of claim 10, further comprising a mounting bracket coupled to one of the side bezels.

13. The system of claim 10, further comprising:

a top bezel coupling the tops of the side bezels; and a bottom bezel coupling the bottoms of the side bezels.

14. The system of claim 10, further comprising:

a top plate coupling the tops of the pair of opposed sides; and a bottom plate coupling the bottoms of the pair of opposed sides.

15. The system of claim 14, further comprising apertures formed in the top and bottom plates to allow air to enter and exit a volume enclosed by the side panels, the top plate, and the bottom plate.

16. The system of claim 14, wherein the top plate comprises a vertical extension for providing a mounting surface.

17. The system of claim 14, further comprising a power supply mounting plate coupled to either the bottom plate or the side panels.

18. The system of claim 10, wherein the slide assembly comprises a pair of slides coupled to respective ones of a pair of slide mounting brackets.

19. The system of claim 10, further comprising the plurality of electronic units supported by respective ones of the plurality of ledges, at least two of the electronic units coupled to one another with a cable.

20. The system of claim 10, wherein the side panels are formed from stainless steel.

21. The system of claim 10, wherein the rack is a 19 inch EIA standard rack.

22. A method for removing electronic equipment from a rack, comprising:

vertically disposing a plurality of electronic units in a chassis, the chassis comprising;

a slide assembly mounted to either an inner top or inner bottom of a rack;

a pair of opposed side panels coupled to the slide assembly, each side panel having a plurality of ledges extending inwardly therefrom configured to support respective ones of the plurality of electronic units;

coupling a pair of side bezels to respective ones of the side panels;

securing the electronic units to the side bezels;

securing the side bezels to the rack;

extending the chassis outwardly from a front of the rack;

disconnecting a cable from a respective one of the electronic units; and removing the respective one of the electronic units from the chassis.

* * * * *